(12) United States Patent
Van Heesch et al.

(10) Patent No.: US 9,367,910 B2
(45) Date of Patent: Jun. 14, 2016

(54) SELF-ASSEMBLABLE POLYMER AND METHODS FOR USE IN LITHOGRAPHY

(71) Applicant: ASML Netherlands B.V., Veldhoven (NL)

(72) Inventors: Christianus Martinus Van Heesch, Eindhoven (NL); Hieronymus Johannus Christiaan Meessen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 46 days.

(21) Appl. No.: 14/369,995

(22) PCT Filed: Jan. 15, 2013

(86) PCT No.: PCT/EP2013/050673
§ 371 (c)(1),
(2) Date: Jun. 30, 2014

(87) PCT Pub. No.: WO2013/107740
PCT Pub. Date: Jul. 25, 2013

(65) Prior Publication Data
US 2014/0363072 A1 Dec. 11, 2014

Related U.S. Application Data

(60) Provisional application No. 61/588,987, filed on Jan. 20, 2012.

(51) Int. Cl.
*G06K 9/00* (2006.01)
*G06T 7/00* (2006.01)
(Continued)

(52) U.S. Cl.
CPC .............. *G06T 7/0008* (2013.01); *G01B 11/03* (2013.01); *G03F 7/0002* (2013.01); *G03F 7/70625* (2013.01); *G06F 17/5045* (2013.01); *G06T 7/001* (2013.01); *G06T 7/0006* (2013.01); *G06T 7/60* (2013.01); *G06T 2207/10061* (2013.01);
(Continued)

(58) Field of Classification Search
USPC .......................... 382/145, 147, 149, 262, 291
See application file for complete search history.

(56) References Cited

U.S. PATENT DOCUMENTS 4,633,504 A * 12/1986 Wihl .............................. 382/144
5,311,600 A    5/1994 Aghajan et al.
(Continued)

FOREIGN PATENT DOCUMENTS

WO          00/03357          1/2000

OTHER PUBLICATIONS

Miri Park et al., "Block Copolymer Lithography: Periodic Arrays of ~$10^{11}$ Holes in 1 Square Centimeter," Science, vol. 276, pp. 1401-1404 (May 30, 1997).
(Continued)

*Primary Examiner* — John Strege
(74) *Attorney, Agent, or Firm* — Pillsbury Winthrop Shaw Pittman LLP

(57) ABSTRACT

A method and system to analyze various dimensional parameters of a structure, such as a self-assembled block copolymer structure whether formed by graphoepitaxy or chemical epitaxy. The method involves image processing including median filtering and feature detection to determine critical dimension information, and optionally the use of a Hough transform to find periodicity values and to determine placement errors.

21 Claims, 14 Drawing Sheets

(51) Int. Cl.
  *G06T 7/60* (2006.01)
  *G06F 17/50* (2006.01)
  *G01B 11/03* (2006.01)
  *G03F 7/00* (2006.01)
  *G03F 7/20* (2006.01)

(52) U.S. Cl.
  CPC ............ *G06T 2207/20032* (2013.01); *G06T 2207/20061* (2013.01); *G06T 2207/30108* (2013.01); *G06T 2207/30148* (2013.01)

(56) References Cited

U.S. PATENT DOCUMENTS

| | | | | |
|---|---|---|---|---|
| 5,555,319 | A * | 9/1996 | Tsubusaki et al. | 382/170 |
| 6,432,729 | B1 * | 8/2002 | Mundt et al. | 438/8 |
| 6,539,106 | B1 * | 3/2003 | Gallarda et al. | 382/149 |
| 7,425,704 | B2 * | 9/2008 | Miyai et al. | 250/310 |
| 7,601,555 | B2 | 10/2009 | Kim et al. | |
| 7,903,867 | B2 * | 3/2011 | Nakahira et al. | 382/149 |
| 8,114,306 | B2 | 2/2012 | Cheng et al. | |
| 8,750,596 | B2 * | 6/2014 | Wang | 382/149 |
| 2007/0230770 | A1 | 10/2007 | Kulkarni et al. | |
| 2009/0042146 | A1 | 2/2009 | Kim et al. | |
| 2009/0233236 | A1 | 9/2009 | Black et al. | |

OTHER PUBLICATIONS

XiaoMin Yang et al., "Directed Block Copolymer Assembly versus Electron Beam Lithography for Bit-Patterned Media with Areal Density of 1 Terabit/inch$^2$ and Beyond," ACS Nano, vol. 3, No. 7, pp. 1844-1858 (2009).

Ze Ji et al., "Quality Inspection of Nanoscale Patterns Produced by Laser Interference Lithography Using Image Analysis Techniques," Proceedings of IEEE International Conference on Mechatronics and Automation, pp. 1835-1840 (Aug. 9-12, 2009).

International Search Report mailed Jun. 30, 2014 in corresponding International Patent Application No. PCT/EP2013/050673.

Chris Bencher et al., "Self-Assembly Patterning for sub-15nm Half-Pitch: A Transition from Lab to Fab," Proc. of SPIE, vol. 7970, No. 1, pp. 79700F-1-79700E-9 (Mar. 17, 2011).

J. Illingworth et al., "A Survey of the Hough Transform," Computer Vision, Graphics and Image Processing, vol. 44, No. 1, pp. 87-116 (Oct. 1, 1988).

* cited by examiner

SELF-ASSEMBLABLE POLYMER AND METHODS FOR USE IN LITHOGRAPHY

CROSS-REFERENCE TO RELATED APPLICATIONS

This application is the U.S. national phase entry of PCT patent application no. PCT/EP2013/050673, which was filed on Jan. 15, 2013, which claims the benefit of priority of U.S. provisional application No. 61/588,987, which was filed on Jan. 20, 2012 and which is incorporated herein in its entirety by reference.

FIELD

The present invention relates to a method of manufacture of a device by lithography. The invention relates to a method and apparatus to check the domain placement accuracy of, for example, a self-assemblable block copolymer that is, e.g., for use in a resist layer.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of surfaces, for example of an imprint template or of other substrates, and chemical resists may be used to achieve this.

The use of self-assembly of a block copolymer (BCP) has been considered as a potential method for improving the resolution to a better value than obtainable by prior art lithography methods or as an alternative to electron beam lithography for preparation of imprint templates.

A self-assemblable block copolymer is a compound useful in nanofabrication because it may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1-5 nm and may be manipulated by modification of the chemical compositions of the blocks of the copolymers.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A block copolymer comprises different blocks, each comprising one or more identical monomers, and arranged side-by-side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene (PS) monomer (hydrophobic block) and polymethylmethacrylate (PMMA) monomer (hydrophilic block). Other block copolymers with blocks of differing hydrophobicity/hydrophilicity may be useful. For instance a tri-block copolymer such as (A-B-C) or (A-B-A) block copolymer may be useful, as may an alternating or periodic block copolymer (e.g. $[-A-B-A-B-A-B-]_n$ or $[-A-B-C-A-B-C]_m$ where n and m are integers). The blocks may be connected to each other by covalent links in a linear or branched fashion or for instance a star configuration.

A block copolymer may form many different phases upon self-assembly, dependent upon the volume fractions of the blocks, degree of polymerization within each block type (i.e. number of monomers of each respective type within each respective block), the optional use of a solvent and surface interactions. When applied in a thin film, the geometric confinement may pose additional boundary conditions that may limit the numbers of phases. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

Suitable block copolymers for use as a self-assemblable polymer include, but are not limited to, poly(styrene-b-methylmethacrylate), poly(styrene-b-2-vinylpyridone), poly (styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetrablock or other multi-block copolymer.

The self-assembled polymer phases may orient with symmetry axes parallel or perpendicular to the substrate and lamellar and cylindrical phases are most interesting for lithography applications, as they may form line and spacer patterns and hole arrays, respectively, and may provide good contrast when one of the domain types is subsequently etched.

Two methods used to guide or direct self-assembly of a polymer, such as a block copolymer, onto a surface are graphoepitaxy and chemical pre-patterning, also called chemical epitaxy. In the graphoepitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a pre-pattern on the substrate.

In the chemical pre-patterning method (referred to herein as chemical epitaxy), the self-assembly of block copolymer domains is guided by a chemical pattern (i.e. a chemical template) on the substrate. Chemical affinity between the chemical pattern and at least one of the types of copolymer blocks within the polymer chain may result in the precise placement (also referred to herein as "pinning") of one of the domain types onto a corresponding region of the chemical pattern on the substrate. For instance if the block copolymer is a di-block copolymer with A and B blocks, where A is hydrophilic and B is hydrophobic in nature, and the chemical pattern comprises a hydrophobic region on a hydrophilic surface, the B domain may preferentially assemble onto the hydrophobic region. As with the graphoepitaxy method of alignment, the resolution may be improved over the resolution of the patterned substrate by the block copolymer pattern subdividing the spacing of pre-patterned features on the substrate (so-called density multiplication). Chemical pre-patterning is not limited to a linear pre-pattern; for instance the pre-pattern may be in the form of a 2-D array of dots suitable as a pattern for use with a cylindrical phase-forming block copolymer. Graphoepitaxy and chemical pre-patterning may be used, for instance, to guide the self-organization of lamellar or cylindrical phases, where the different domain types are arranged side-by-side on a surface of a substrate.

In a process to implement the use of block copolymer self-assembly in nanofabrication, a substrate may be modified with a neutral orientation control layer, as part of the chemical pre-pattern or graphoepitaxy template, to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented parallel to the plane of the surface. Perpendicular orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "perpendicular orientation" it is meant that the domains of each block will be positioned side-by-side at the substrate surface, with the interfacial regions between domains of different blocks lying substantially perpendicular to the plane of the surface.

A neutral surface for use in chemical epitaxy and graphoepitaxy is particularly useful. It may be used on surfaces between specific orientation regions of an epitaxy template. For instance in a chemical epitaxy template to align a di-block copolymer with A and B blocks, where A is hydrophilic and B is hydrophobic in nature, the chemical pattern may comprise hydrophobic pinning regions with a neutral orientation region between the hydrophobic regions. The B domain may preferentially assemble onto the hydrophobic pinning regions, with several alternating domains of A and B blocks aligned over the neutral region between the specific (pinning) orientation regions of the chemical pre-pattern.

For instance in a graphoepitaxy template to align such a di-block copolymer the pattern may comprise hydrophobic resist features with a neutral orientation region between the hydrophobic resist features. The B domain may preferentially assemble alongside the hydrophobic resist features, with several alternating domains of A and B blocks aligned over the neutral orientation region between the specific (pinning) orientation resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to 40 nm. The neutral orientation layer may, for instance, be provided with one or more gaps therein to permit one of the block types of the self-assemblable layer to come into direct contact with the substrate below the neutral orientation layer. This may be useful for anchoring, pinning or aligning a domain of a particular block type of the self-assemblable polymer layer to the substrate, with the substrate surface acting as a specific orientation feature.

A thin layer of self-assemblable polymer may be deposited onto the substrate, onto a graphoepitaxy or chemical epitaxy template as set out above. A suitable method for deposition of the self-assemblable polymer is spin-coating, as this process is capable of providing a well defined, uniform, thin layer of self-assemblable polymer. A suitable layer thickness for a deposited self-assemblable polymer film is approximately 10 to 100 nm. Following deposition of the block copolymer film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

SUMMARY

Self-assembly of a block copolymer is a process where the assembly of many small components (the block copolymer) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of chemical epitaxy or graphoepitaxy may greatly reduce defect formation.

For a polymer which undergoes self-assembly, the self-assemblable polymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperatures up to a few tens of ° C. above or below the order/disorder temperature $T_{OD}$ for the polymer, say up to about 50° C.

Ordering and defect annihilation may be combined into a single annealing process or a plurality of processes may be used in order to provide a layer of self-assembled polymer such as block copolymer, having an ordered pattern of domains of differing chemical type (of domains of different block types), for use as a resist layer for lithography.

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the pattern features of the second domain type.

Following the breakthrough etching, the pattern may be transferred by so-called transfer etching using an etching means which is resisted by the second domain type and so forms recesses in the substrate surface where the surface has been laid bare. Other methods of transferring a pattern, known in the art, may be applicable to a pattern formed by self-assembly of a block copolymer.

Although the techniques set out above to apply a block copolymer self-assembled layer to a surface provides partial alignment of the block copolymer structure on a surface, the resulting self-assembled layer may exhibit a high level of incorrectly aligned polymer molecules, leading to a defect and/or poor uniformity in domain placement, which in turn may result in an undesirable variation in critical dimension.

In a self-assembled structure, for example, a defect is likely to be present, since in most cases, the thermodynamic driving force for self-assembly is provided by weak intermolecular interactions and is typically of the same order of magnitude as the entropy term. This characteristic may be one of the main limitations in the exploitation of self-assembled features for lithography. Current state-of-the-art self-assembled layers may exhibit a defect rate of 1 in $10^3$ to 1 in $10^4$, expressed as the number of non-functional features of a multi-component device derived from the self-assembled layer (see for example Yang et. al, ACS Nano, 2009, 3, 1844-1858). This is several orders of magnitude higher than a defect level suitable for commercial effectiveness. These defects may appear as grain boundaries (discontinuities in the pattern) or as dislocations.

Self-assembly of a block copolymer is a process where the assembly of many small components (the block copolymer) results in the formation of larger more complex structures (the nanometer sized features in the self-assembled pattern, referred to as domains in this specification) and the defects may arise naturally from the physics controlling the self assembly of the polymer. Self-assembly is driven by the differences in interactions (i.e. differences in mutual chemical affinity) between A/A, B/B and A/B (or B/A) block pairs of, for example, an A-B block copolymer, with the driving force for phase separation described by Flory-Huggins theory for the system under consideration.

For a block copolymer which undergoes self-assembly, the block copolymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The block copolymer may also exhibit a glass transition temperature Tg below which the polymer is effectively immobilized and above which the copolymer molecules may still reorient within a layer relative to neighboring copolymer molecules. The glass transition temperature may be suitably measured by differential scanning calorimetry (DSC).

If $T_{OD}$ is less than Tg for the block copolymer, then a self-assembled layer will be unlikely to form or will be highly defected because of the inability of the molecules to align correctly when below $T_{OD}$ and below Tg. A desired block copolymer for self assembly has $T_{OD}$ higher than Tg. However, once the molecules have assembled into a solid-like layer, even when annealed at a temperature above Tg but below $T_{OD}$, the mobility of the polymer molecules may be insufficient to provide intermingling of coiled polymer chains to allow the molecules to relax into their states of lowest total free energy. This may result in domain placement error for the self-assembled polymer, where the phase separated domains of differing polymer blocks are not precisely located on the ideal theoretical lattice positions that they would occupy if the lowest total free energy state was reached.

Accordingly it is desirable to provide a method and apparatus to analyze and check, for example, the self-assembled block co-polymer structure and in particular to check the pitch and periodicity of the structure. This may be done by taking an automated scanning electron microscope (SEM) image and analyzing the image using image analysis software. Typically, hundreds of images are generated of the pattern across the substrate in order to obtain meaningful statistics and to determine spreads across the substrate. Due to the large amount of data the analysis is performed automatically by image recognition algorithms.

For a block co-polymer, depending on the molecular weights of each block of the polymer, the pitch of chemical epitaxy patterning, the trench width in graphoepitaxy, and the processing conditions, a certain periodicity and hole size is obtained (usually smaller than 30 nm). Typically, the intended application will have a specification of the certain maximum placement error (PLE) and a specification for a critical dimension uniformity (CDU). To analyze if a self-assembled block co-polymer structure meets these specifications an automated image analysis is used.

However, due to the nature of the self-assembly process, there is a statistical spread in periodicity of the self-assembled features which is an additional cause for placement error that typically does not occur for optical lithography. For example, in the case of graphoepitaxy a trench can result in two different periodicities with two different spreads; namely a periodicity parallel to the trench and a periodicity perpendicular to the trench. For chemical epitaxy typically a two-dimensional surface pattern is used to align hexagonal patterned block co-polymer and in this case there will be variations in periodicity owing to small rotation with respect to the alignment pattern. In general terms a self-assembled block co-polymer can display a Gaussian distribution in periodicity and as a result the placement error is caused by a combination of arbitrary starting point of the self-assembly pattern and the distribution in periodicity. Existing methods and software for SEM image analysis cannot accurately analyze such structures with continuously changing periodicity.

According to an embodiment of the present invention, there is provided a computer-implemented method to carry out an analysis of dimensional parameters of a structure, the method being implemented in a computer comprising a processor communicating with a memory and the method comprising:

inputting, to the processor, image data of the structure, using, in the processor, a filter to create a filtered image, detecting, by the processor, features in the filtered image corresponding to domains in the structure, determining, by the processor, the co-ordinates of each feature, determining, by the processor, a critical dimension for each feature, determining, by the processor, at least one set of the features that are collinear features, fitting, by the processor, a periodic curve to the collinear features to determine the periodicity of the features, and obtaining, by the processor, placement errors for the features by comparing detected feature positions with expected positions.

In an embodiment the structure is a block co-polymer or a self-assembled block copolymer structure for use in lithography.

In an embodiment the filter comprises a median filter.

In an embodiment, the collinear features are determined by the processor using a transform function. In an embodiment, the transform function is a Hough transform.

In an embodiment, the co-ordinates are determined by calculating the middle of a bounding box.

In an embodiment, the critical dimension is a diameter of the feature or is an area of the feature. In an embodiment, the method may further comprise calculating, by the processor, a critical dimension uniformity. The critical dimension uniformity may be calculated as three times the standard deviation of the critical dimensions of all detected features.

In an embodiment, the method may further comprise excluding, by the processor, features considered to be defective. For example a feature may be considered to be defective if it has a diameter smaller than a certain (e.g., predefined) size, and/or if it is located further from an intersection of the grid larger than a certain fraction of the periodicity of the grid.

Optionally, the method may further comprise defining a defectivity in terms of the number of defect features as a proportion of the total number of expected features.

In an embodiment, the placement errors comprise local placement errors for individual features.

In an embodiment, the placement errors comprise absolute placement errors obtained by comparing, by the processor, the co-ordinates of a detected feature with a grid obtained from fitting the periodic curve to the collinear features.

In an embodiment, the placement errors comprise relative placement errors obtained by comparing, by the processor, the co-ordinates of a detected feature with a grid of a certain periodicity.

In an embodiment, the method may further comprise comparing, by the processor, the dimensional parameters with certain parameter requirements.

According to another aspect, there is provided a computer-implemented method to carry out an analysis of dimensional parameters of a structure, the method being implemented in a computer comprising a processor communicating with a memory and the method comprising:

inputting, to the processor, image data of the structure, using, in the processor, a filter to create a filtered image, detecting, by the processor, features in the filtered image corresponding to domains in the structure, and determining, by the processor, a critical dimension for each feature.

According to another aspect, there is provided a computer-implemented method to carry out an analysis of dimensional parameters of a structure, the method being implemented in a computer comprising a processor communicating with a memory and the method comprising:

inputting, to the processor, image data of the structure, using, in the processor, a filter to create a filtered image, detecting, by the processor, features in the filtered image corresponding to domains in the structure, determining, by the processor, the co-ordinates of each feature, and determining, by the processor, at least a set of the features that are collinear features and a corresponding line on which the features are located.

According to another aspect, there is provided a system to carry out an analysis of dimensional parameters of a structure, the system comprising a computer comprising a processor communicating with a memory, the processor configured to perform a method comprising:

receiving, as an input, image data of the structure, creating a filtered image using a filter, detecting features in the filtered image corresponding to domains in the structure, determining the co-ordinates of each feature, determining a critical dimension for each feature, determining at least one set of the features that are collinear features, fitting a periodic curve to the collinear features to determine the periodicity of the features, and obtaining placement errors for the features by comparing detected feature positions with expected positions.

In an embodiment, the structure is a block co-polymer structure or a self-assembled block copolymer structure for use in lithography.

In an embodiment, the processor implements a median filter as the filter.

In an embodiment, the processor determines collinear features using a transform function. In an embodiment, the transform function is a Hough transform.

In an embodiment, the processor determines the co-ordinates by calculating the middle of a bounding box.

In an embodiment, the critical dimension is a diameter of the feature, and/or is an area of the feature.

In an embodiment, the processor is further configured to calculate a critical dimension uniformity. In an embodiment, the critical dimension uniformity is calculated as three times the standard deviation of the critical dimensions of all detected features.

In an embodiment, the processor is configured to exclude features considered to be defective. For example a feature may be considered to be defective if it has a diameter smaller than a certain (e.g., predefined) size, and/or a feature may considered to be defective if it is located further from an intersection of the grid larger than a certain fraction of the periodicity of the grid. In an embodiment, the processor may be configured to define a defectivity in terms of the number of defect features as a proportion of the total number of expected features.

In an embodiment, the placement errors comprise local placement errors for individual features.

In an embodiment, the placement errors comprise absolute placement errors and the processor is configured to obtain the absolute placement errors by comparing the co-ordinates of a detected feature with a grid obtained from fitting the periodic curve to the collinear features.

In an embodiment, the placement errors comprise relative placement errors and the processor is configured to obtain the relative placement errors by comparing the co-ordinates of a detected feature with a grid of a certain periodicity.

In an embodiment, the processor is configured to compare the dimensional parameters with certain parameter requirements.

According to another aspect, there is provided a system to carry out an analysis of dimensional parameters of a structure, the system comprising a computer comprising a processor communicating with a memory, the processor configured to perform a method comprising:
receiving, as an input, image data of the structure,
creating a filtered image using a filter,
detecting features in the filtered image corresponding to domains in the structure, and
determining, a critical dimension for each feature.

According to another aspect, there is provided a system to carry out an analysis of dimensional parameters of a structure, the system comprising a computer comprising a processor communicating with a memory, the processor configured to perform a method comprising:
receiving, as an input, image data of the structure,
creating a filtered image using a filter,
detecting features in the filtered image corresponding to domains in the structure,
determining the co-ordinates of each feature, and
determining at least a set of the features that are collinear features and a corresponding line on which the features are located.

It will also be understood that an embodiment of the invention may include a computer program product which when run on a computer causes the computer to carry out a method as described herein.

BRIEF DESCRIPTION OF THE DRAWINGS

Some embodiments of the invention will now be described by way of example and with reference to the accompanying Figures, in which.

DETAILED DESCRIPTION OF PREFERRED EMBODIMENTS

Figure 1A:
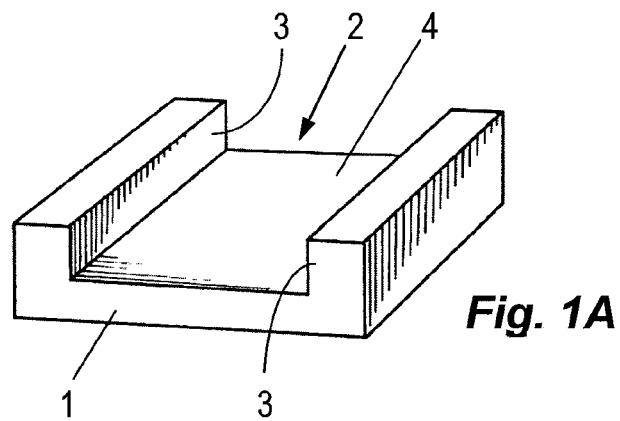
FIGS. 1A to 1C schematically depict directed self-assembly of A-B block copolymer onto a substrate by graphoepitaxy and formation of relief patterns by selective etching of one domain.
Figure 1B:
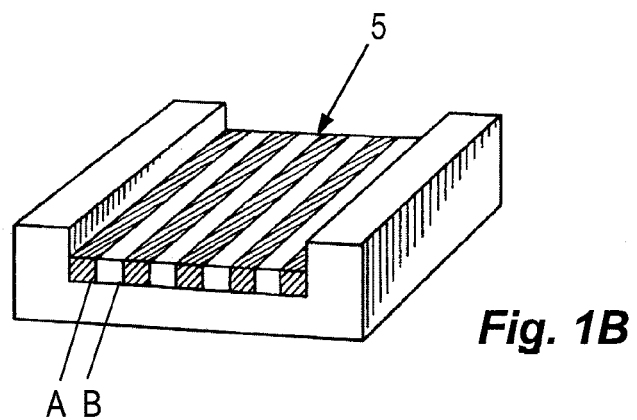
Figure 1C:
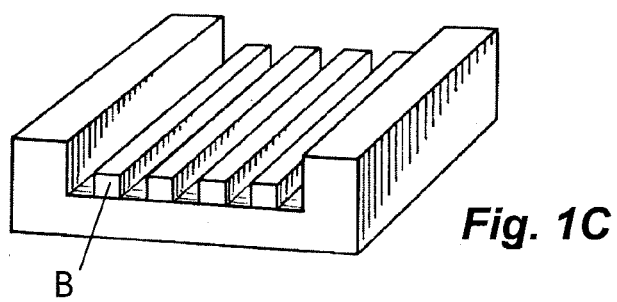

FIG. 1A shows a substrate 1 with a trench 2 formed therein bounded by side walls 3 and a bottom surface 4. In FIG. 1B, a self-assemblable A-B block copolymer with, e.g., hydrophilic A blocks and, e.g., hydrophobic B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the a side wall 3, which is also, e.g., hydrophilic. In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may be achieved, for instance, by selective photo-degradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each side wall.

Figure 2A:
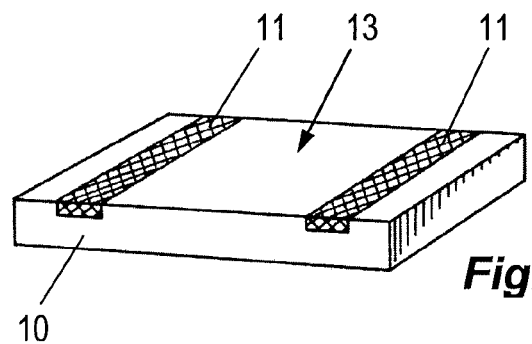
FIGS. 2A to 2C schematically depict directed self-assembly of A-B block copolymer onto a substrate by chemical pre-patterning and formation of relief patterns by selective etching of one domain.
Figure 2B:
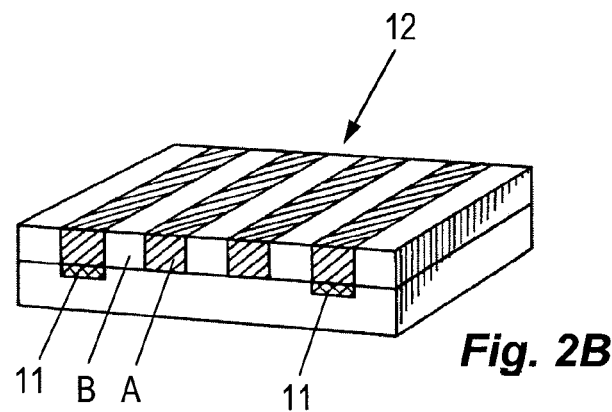
Figure 2C:
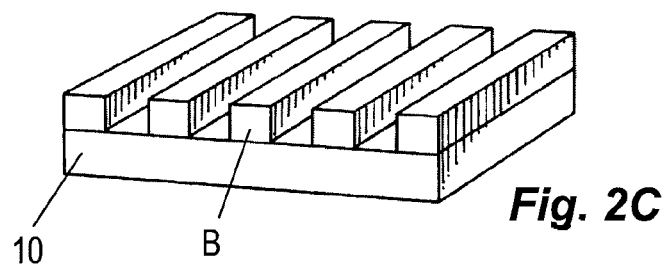

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with, e.g., hydrophilic A blocks and, e.g., hydrophobic B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning. The type A domains have nucleated atop the pinning stripes 11, which are also, e.g., hydrophilic. In FIG. 1C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

Figure 3A:
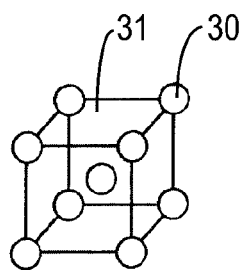
FIGS. 3A to 3E schematically depict the different phases formed by a poly(styrene-b-methylmethacrylate) polymer as the relative volume fractions of the polystyrene and PMMA blocks are varied relative to each other.
Figure 3B:
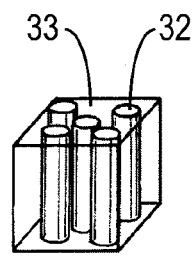

In FIG. 3, FIGS. 3A to 3B show the progression of different phases formed by a self-assembled poly(styrene-b-methyl-methacrylate) block copolymer in thin films on a surface. In FIG. 3A, a cubic phase is shown with the discontinuous domains being spheres 30 of PMMA within a continuous domain 31 of PS for a ratio PS:PMMA of 80:20.

Figure 3C:
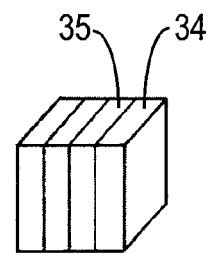
Figure 3D:
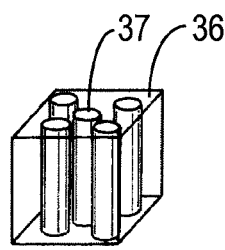
Figure 3E:
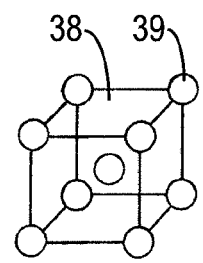

As the ratio PS:PMMA reduces to 70:30, a cylindrical phase is formed with the discontinuous domains being cylinders 32 of PMMA and a continuous domain 31 of PS. At 50:50 ratio, a lamellar phase is formed as shown in FIG. 3C with one or more lamellae 34 of PMMA and one or more lamellae 35 of PS. With a ratio of 30:70 PS:PMMA, an inverted cylindrical phase is formed, shown in FIG. 3D, with the discontinuous domains being cylinders 37 of PS and a continuous domain 36 of PS. At a ratio of 20:80, shown in FIG. 3E, an inverted cubic phase is formed with discontinuous domains being spheres 39 of PS within a continuous domain 38 of PMMA.

Figure 4A:
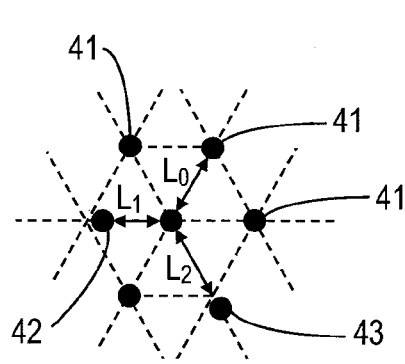
FIG. 4 schematically depicts a block copolymer self assembled into a cylindrical phase having 2-D hexagonal symmetry in FIG. 4A and into a lamellar phase in FIG. 4B, the depictions demonstrating domain placement errors and line edge roughness respectively.

FIG. 4A schematically depicts a block copolymer self-assembled into a cylindrical phase having 2-D hexagonal symmetry. Discontinuous domains of one block of the block copolymer should be uniformly spaced on an ideal hexagonal lattice, separated by a continuous domain of the other block of the block copolymer. The arrangement of broken lines shows the ideal theoretical hexagonal array onto which the block copolymer should self-assemble, with the domains 41 shown placed correctly on the ideal lattice. These ideally placed domains are mutually separated by a pitch $L_0$ measured between their centers. Domain 42 is shown misplaced from the ideal lattice so that it is a distance $L_1$ from the central domain with $L_1$ being less than $L_0$. Domain 43 is shown displaced from the lattice so it is at a distance $L_2$ from the central domain, with $L_2$ being greater than $L_0$.

These placement errors are referred to herein as domain placement errors. There may, additionally or alternatively, be differences in the sizes of the domains. This may lead to poor critical dimension uniformity (poor CDU) for the self-assembled polymer array.

Figure 4B:
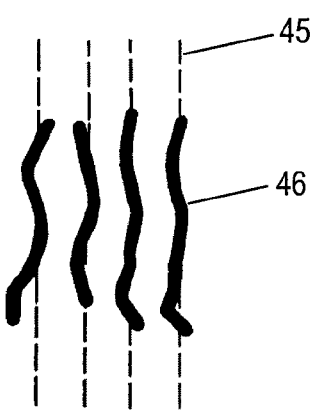

In FIG. 4B, the broken lines 45 show the ideal placement positions for first domains 46 of a first block of a block copolymer forming a lamellar phase, separated from each other by second domains of second block of the block copolymer. The deviation from ideal placement and hence from linearity of the first domains 46 is referred to herein as line edge roughness.

Figure 5:
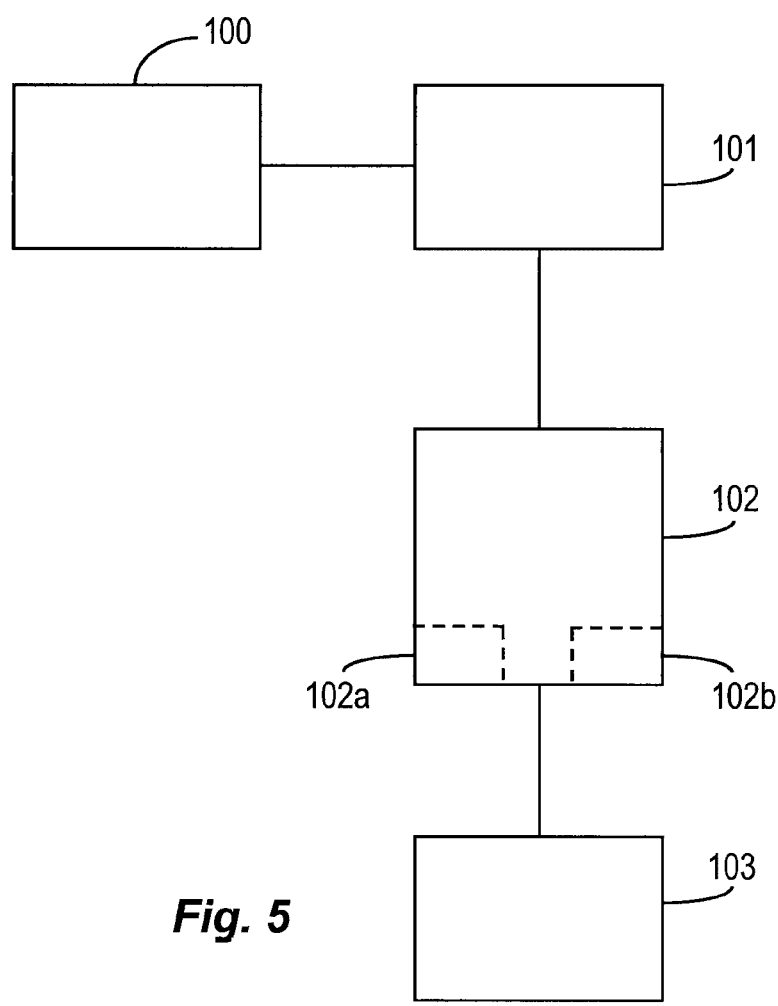
FIG. 5 is a schematic block diagram of an apparatus according to an embodiment of the invention.

FIG. 5 shows schematically an apparatus to analyze and check one or more parameters such as critical dimension uniformity and/or placement error in a self-assembled block co-polymer structure according to an embodiment of the invention. The apparatus includes a scanning electron microscope (SEM) 100 including an image capture mechanism, memory 101 to store SEM images obtained by scanning electron microscope 100, a processor 102, and output 103. The apparatus of FIG. 5 may be used to carry out a method that will be described below with reference to the flowchart of FIG. 6 and the example described with reference to FIGS. 7 to 14.

Figure 7:
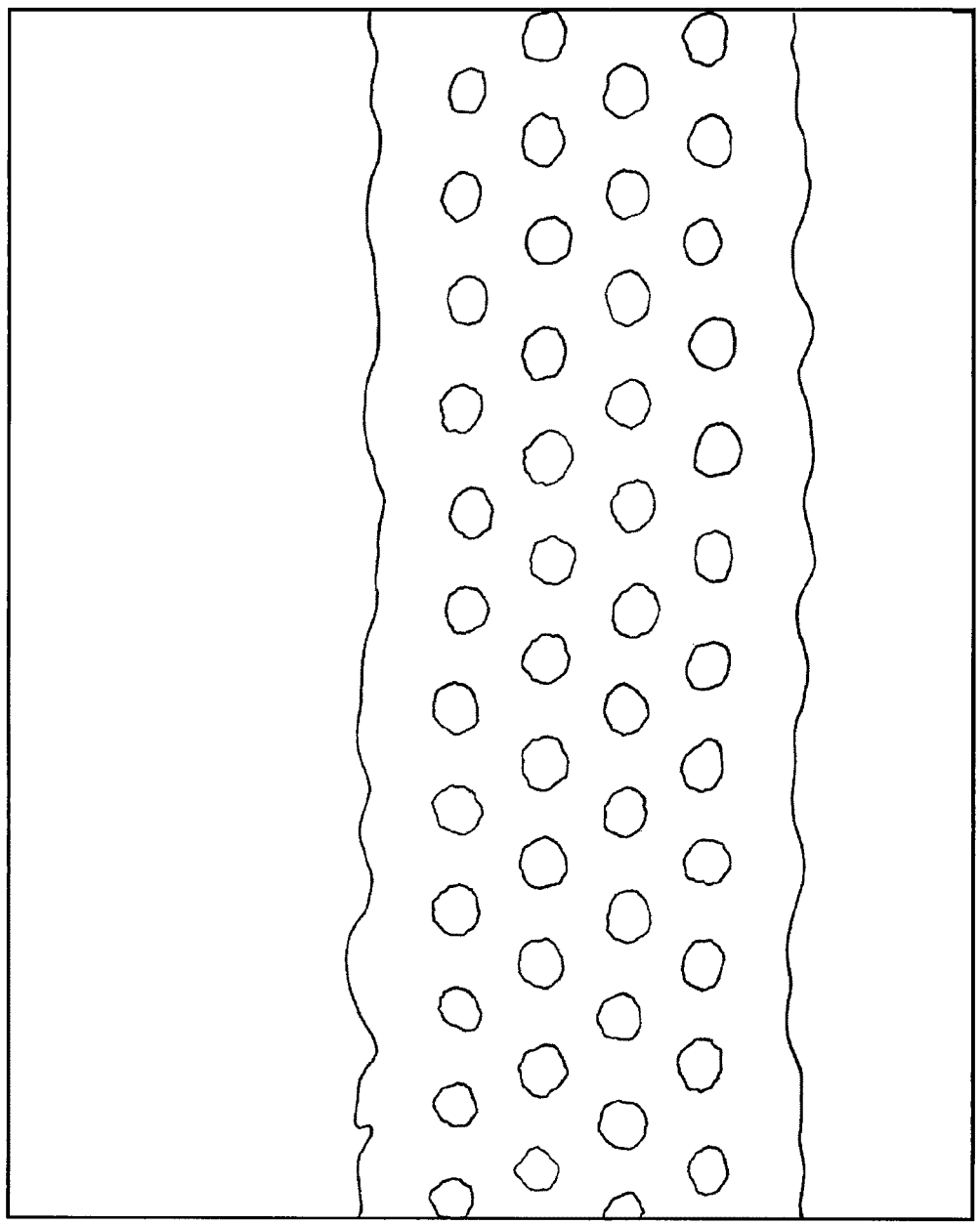
FIG. 7 is an example of a SEM image of a self-assembled block copolymer structure.

In an embodiment, the scanning electron microscope 100 is used to analyze a substrate formed with graphoepitaxy trenches each of about 200 nm in width and filled with a self-assembled block copolymer in a hexagonal pattern. Ten positions on the substrate are examined each with ten images making a total of 100 SEM images that are captured and stored in memory 101. FIG. 7 shows an example of an unprocessed SEM image showing a hexagonal array of three rows of domains.

Figure 6:
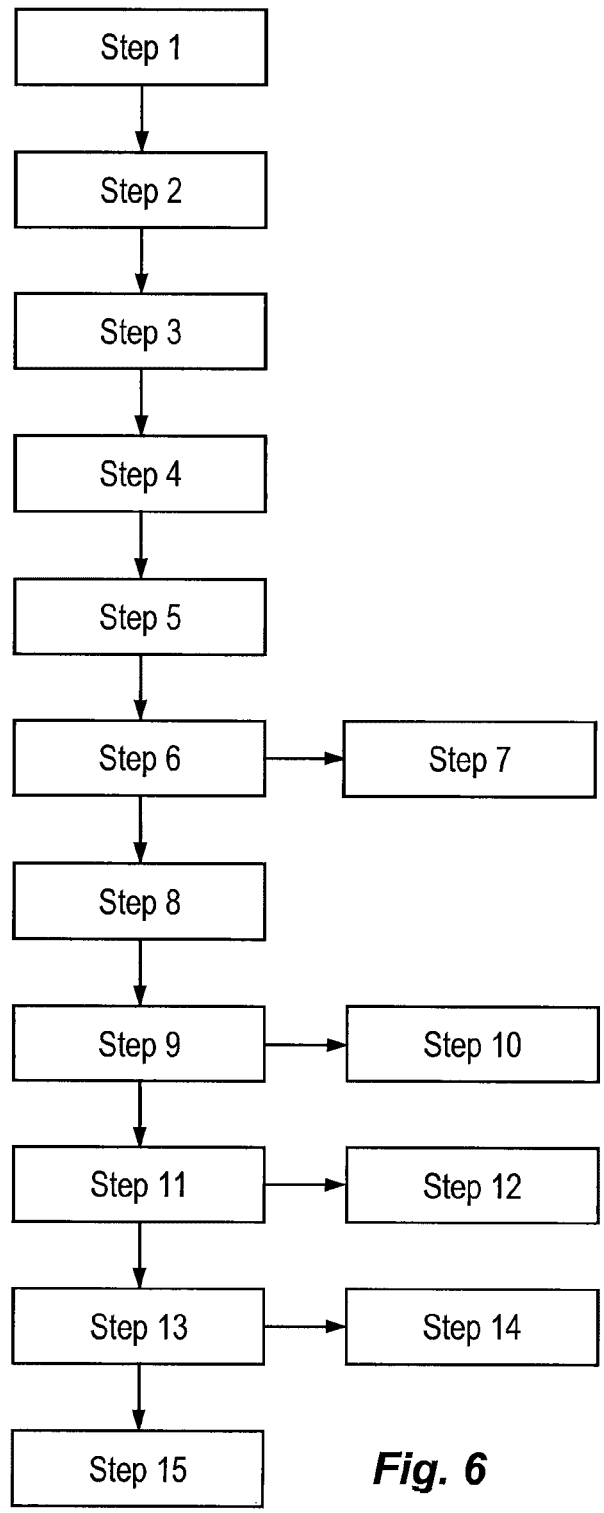
FIG. 6 is a flowchart showing a method according to an embodiment of the invention.
Figure 8:
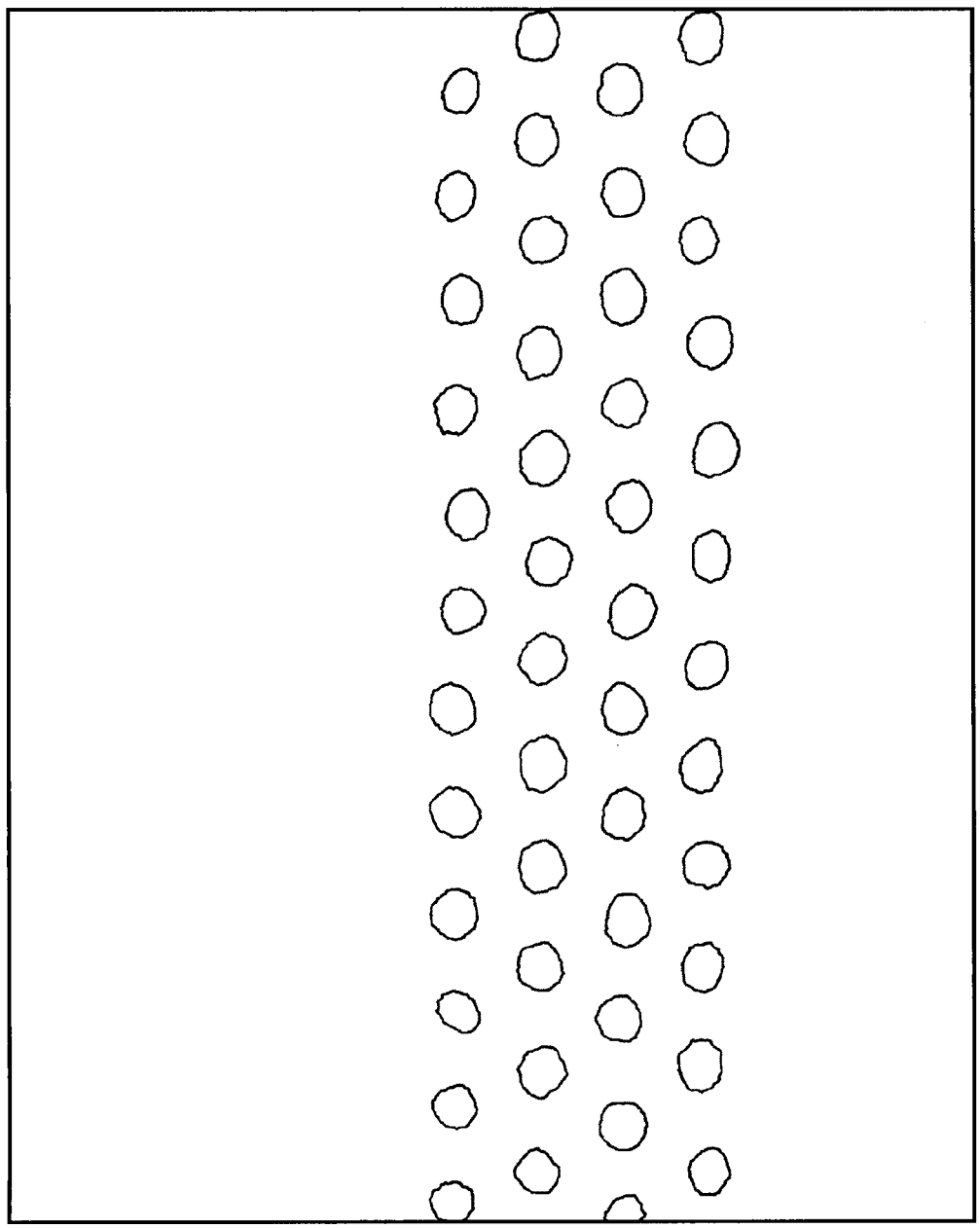
FIG. 8 shows the structure of FIG. 7 after processing through a median filter.
Figure 9:
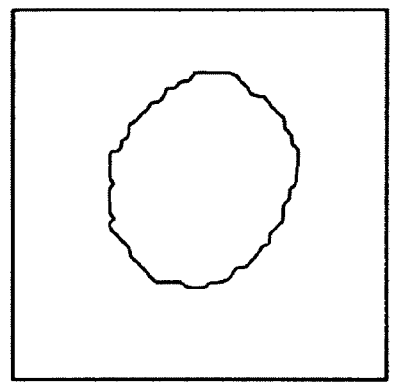
FIG. 9 shows a detailed view of one domain from FIG. 8.
Figure 10:
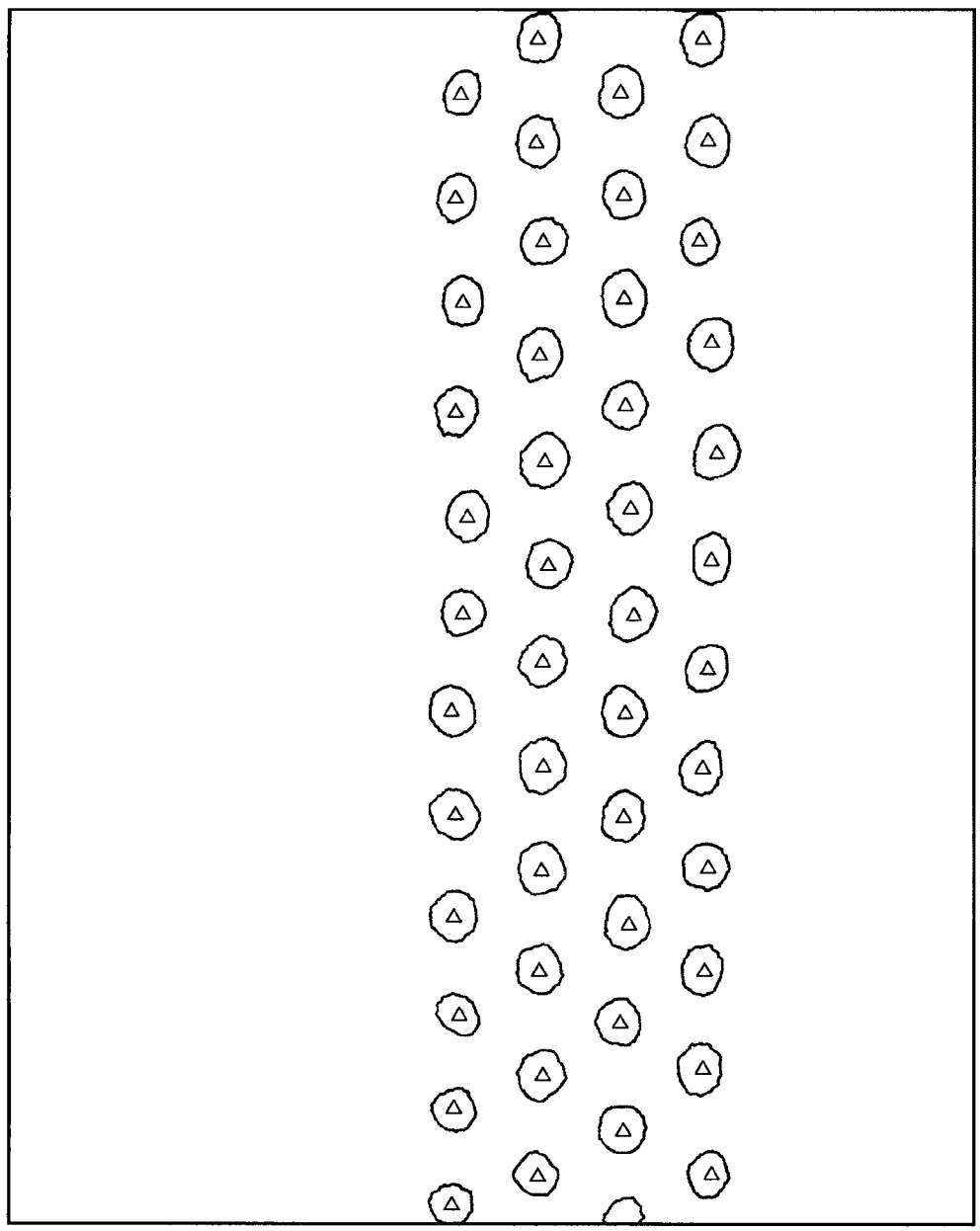
FIG. 10 is an image of the structure showing the detected features.
Figure 11:
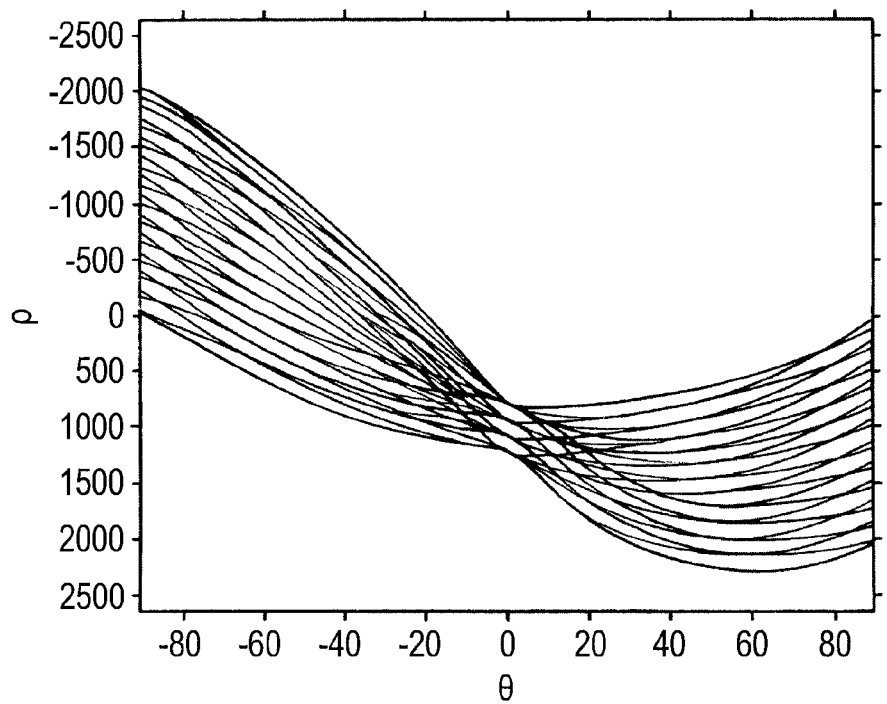
FIG. 11 shows the plots obtained from performing a Hough transform on the image of FIG. 10.

Referring to the flowchart of FIG. 6, in Step 1 the processor 102 reads a SEM image from a directory within the memory 101. In Step 2 the processor applies a 2D median filter 102a to the image to generate a black and white image as shown in FIG. 8. FIG. 9 shows one of the domains from FIG. 8 in more detail. A median filter comprises a known non-linear digital filtering technique used as a pre-processing step to remove noise prior to further image processing. The strength of the filter 102a will be determined by the resolution of the SEM image and is typically set in such a way as to remove the block co-polymer structure from surrounding noise. The median filter 102a may be formed by any combination of hardware and/or software elements as is known in the art and while for convenience of illustration in FIG. 5 the median filter 102a is shown as part of the processor 102, it could also be formed as part of a separate processor where the processor 102 would send image data to the median filter for processing and the processed image data would be returned by the median filter 102a to the processor 102 for further processing. Other filters that could be used in embodiments of this invention include standard 2D linear filtering or a Weiner filter In Step 3 the image following processing by the 2D median filter is further analyzed. In particular all white features are labeled as defined by Haralick, Robert M et al., *Computer and Robot Vision*, Vol. 1, Addison-Wesley, 1992, 28-48. For every labeled feature, in Step 4, the center of gravity is determined by calculating the middle of the bounding box to provide the co-ordinates of the feature for example by using the bwlabel function in Matlab. In Step 5 the area (in terms of pixels) for every detected feature is determined and a corresponding width is calculated, for example diameter assuming that the feature is circular. In this example (for a hexagonal packed cylindrical phase) this calculated diameter is considered to be the critical dimension CD. In Step 6 the CDU is determined as being three times the standard deviation of the diameter for all features on the basis of an assumption of a Gaussian distribution. FIG. 10 shows the detected features resulting from these steps where the detected features are labeled with a triangle indicating their position.

The CD and the CDU are significant parameters in determining the quality of the self-assembled block co-polymer structure and whether the structure meets application specifications. Therefore in Step 7 the results of Steps 5 and 6 may be output from processor 102 to output 103. Output 103 may take any suitable form and may comprise the output of data in printed form, on a visual display unit, or may comprise data in a form to be stored either in memory 101 or in some other memory, or data as may be used in any other analytical process. Output 103 may also comprise a computer or computer terminal at which further processing may be carried out. Optionally in Step 7 the data may be compared with application requirements and the output of data may include a comparison of the determined CD, CDU with such specifications together with an indication of whether the self-assembled structure meets the specifications.

The data output at Step 7 represents a significant stage in obtaining analytical results concerning the self-assembled structure. However, in an embodiments, additional information can be obtained starting from the filtered image produced after Step 2 as will now be described.

In Step 8 the filtered image is subject to a generalized Hough transform. The Hough transform is carried out by the processor 102 and is shown in FIG. 5 by reference numeral 102b. The Hough transform 102b may be formed by any combination of hardware and/or software elements as is known in the art and while for convenience of illustration in FIG. 5 the Hough transform 102b is shown as part of the processor 102, it could also be formed as part of separate processor where the processor 102 would send image data to the Hough transform for processing and the processed image data would be returned to the processor 102 for further processing. The Hough transform is a technique used in image analysis to detect simple shapes in particular where the shape to be detected may be imperfect. In a generalized Hough transform when used to detect a straight line an image point (x,y) is converted into a parameter space (r, θ) where r is the distance of the line from the origin while θ is the angle between the perpendicular line r and the x axis using the equation r=x cos θ+y sin θ. The points $(x_i, y_i)$ for a given image point i are known while r and θ are unknown and are determined. If all possible values of r and θ are calculated and plotted in Hough space they give a curved line. When viewed in Hough space points i that are collinear in Cartesian space are apparent as they give curves which intersect at a common point (r, θ) as can be clearly seen from FIG. 11 which shows the results of such a Hough transform in the present example.

Figure 12A:
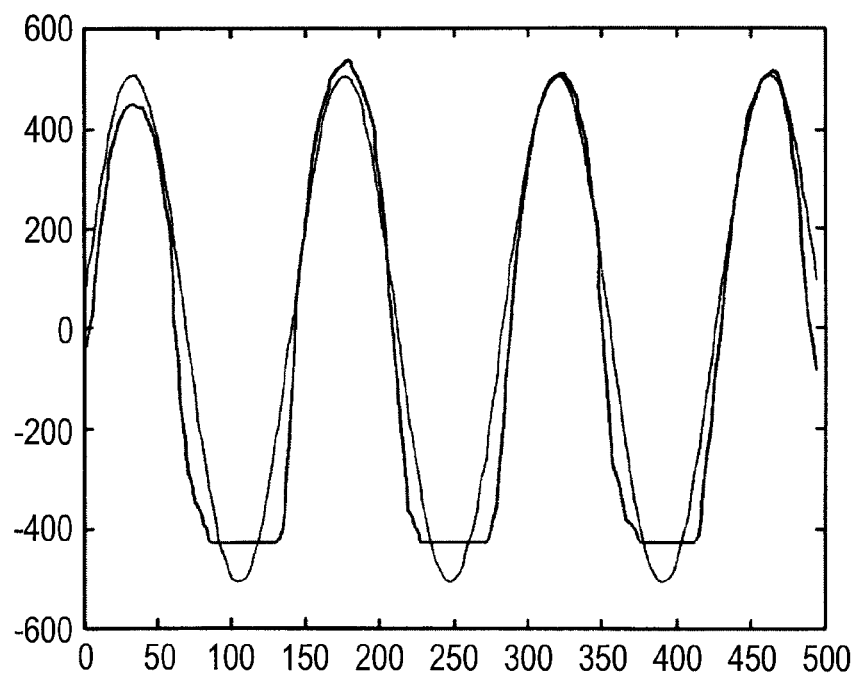
FIGS. 12a and 12b show the fit of periodic curves to the results obtained from the Hough transform.
Figure 12B:
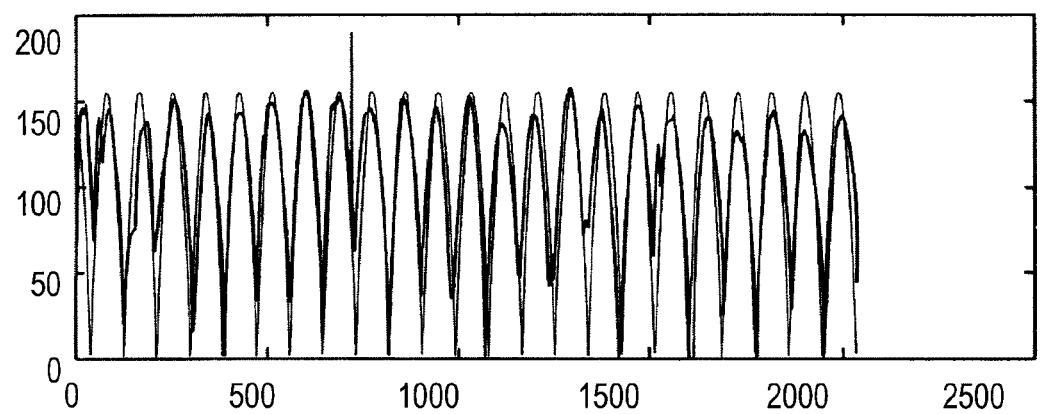

In Step 9, the processor 102 takes from the Hough transform the values corresponding to vertical and horizontal lines and fits them with respective non-linear periodic (e.g. sinusoidal) curves as can be seen from FIGS. 12a and 12b. It will be understood in this example that there are two sets of lines—and hence two potentially different periodicities—one "vertical" set of lines in the direction of the trenches, the other "horizontal" in a direction perpendicular to the trenches. The fit for the vertical lines is shown in FIG. 12a, the fit for the horizontal lines is shown in FIG. 12b. The fitted periodicities in the horizontal and vertical directions of the periodic (e.g. sinusoidal) function represent the periodicities of the self-assembled block copolymer structure (depending on the orientation of the structure the periodicity in one of the directions needs to be divided by a factor of $0.5\sqrt{3}$) and may be output by the output 103 either as an independent result and/or for further processing.

Figure 13:
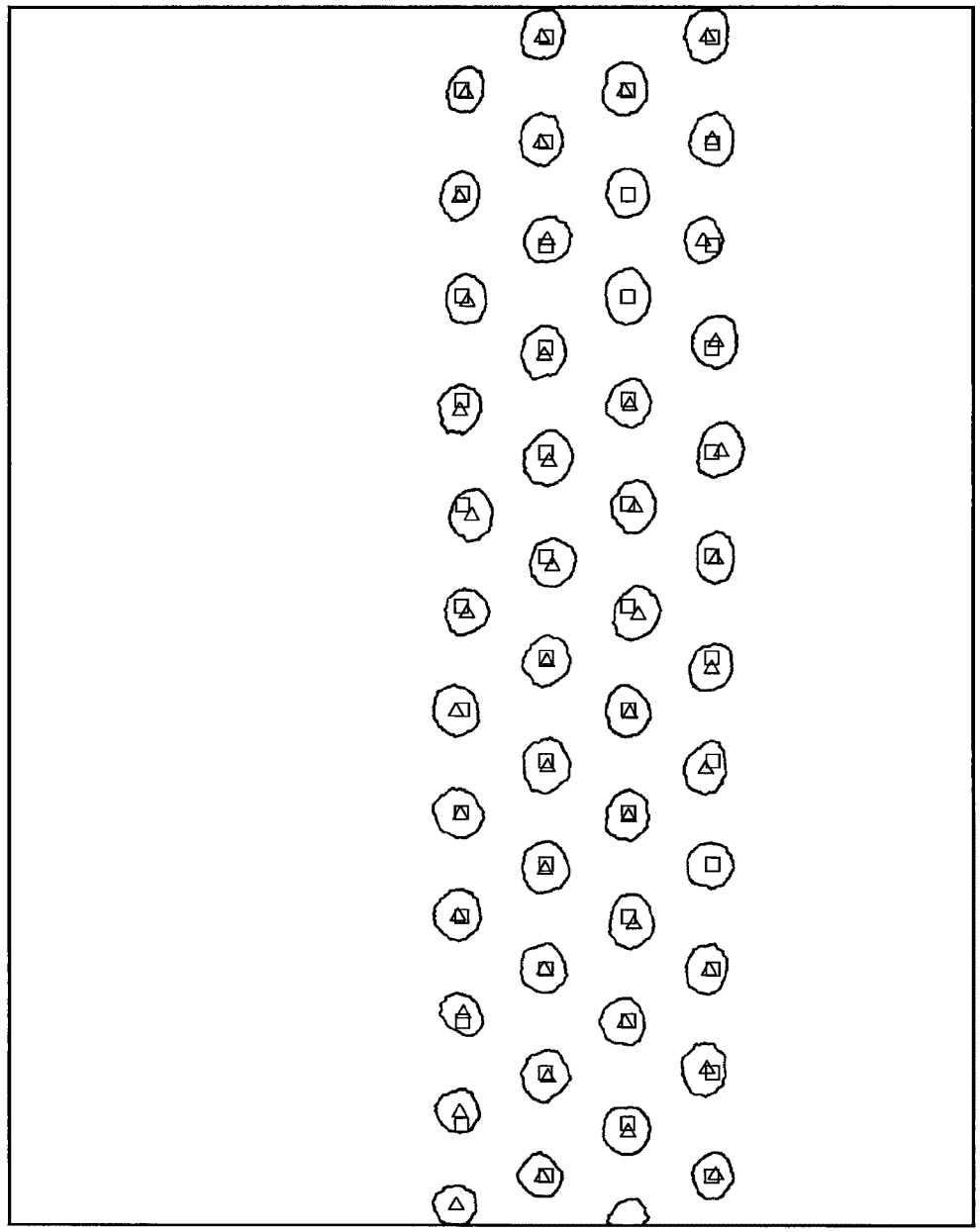
FIG. 13 shows an image combining detected and fitted features.

In Step 10 the fitted periodicity data can be combined with the detected features (FIG. 10) to determine local placement errors (LPE) as illustrated in FIG. 13. In particular, using the positions of the maxima of the fitted sinusoidal functions (FIGS. 12a and 12b) a grid is constructed in such a way that the grid points correspond to the co-ordinates of the detected features (FIG. 10) obtained in Step 4. This is done by taking the maxima of the periodic functions fitted through the Hough transforms of the vertical and horizontal lines and pairing them to form grid co-ordinates shown by the squares in FIG. 10. Then a nearest neighbor search algorithm is used to pair up the grid co-ordinates with the centers of gravity of the correspondingly previously detected features (shown by the triangles in FIG. 13). For a perfect regular self-assembled structure the grid points and the co-ordinates will overlap exactly but where there are placement errors they will not. In Step 10 the distance in x and y directions of every feature from its corresponding grid point is determined to calculate its local placement error which may be output by the output 103.

Figure 14:
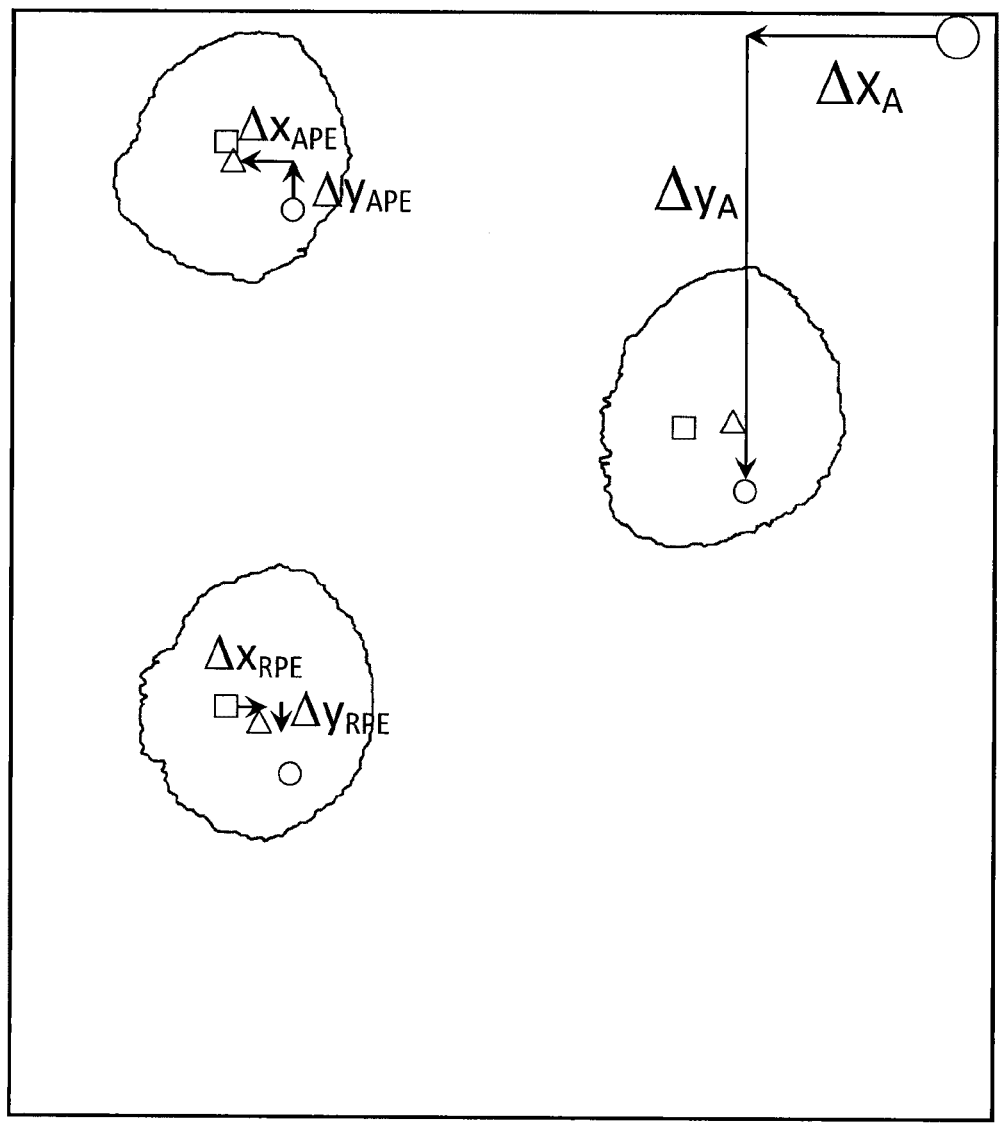
FIG. 14 shows an image combining detected and determined features.

Other measures of placement error may be determined. For example, in Step 11 a relative placement error (RPE) may be calculated using an average predetermined periodicity as defined by Step 9 to create a grid placed in such a way to reduce or minimize the total distance of the co-ordinates of the features from the corresponding grid points. By determining the absolute distance in the x and y directions of every feature from its associated grid point a statistical placement error can be calculated but in this case it is a relative placement error (RPE). The RPE values can be output in Step 12. Another option is Step 13 where an absolute placement error (APE) is determined using a grid with a certain (e.g., pre-defined) periodicity and the position and distance from the grid point of each feature is determined and output in Step 14. The distances correspond to the APE. The calculations of APE and RPE are illustrated in FIG. 14.

In Step 15 defective domains can be determined and excluded. This is done by taking the detected features from Step 4 and where a feature is smaller than a certain (e.g., predetermined) size (e.g., in diameter and/or area terms) the feature is considered to be defective and is disregarded in the calculations of placement error. Furthermore, features that are a distance from the nearest grid point that is larger than a certain (e.g., predetermined) fraction of the periodicity are additionally or alternatively excluded. The difference between the number of grid points in an area of interest and the number of features is defined as the number of defects, and the defectivity can be defined as the ratio of the number of defects to the total number of grid points per unit area of a cell of a grid.

Embodiments are also described below in numbered clauses:

1. A method to carry out an analysis of dimensional parameters of a structure, the method being implemented in a computer comprising a processor communicating with a memory and the method comprising:

using, in the processor, a filter to create a filtered image from image data of the structure, detecting, by the processor, features in the filtered image corresponding to domains in the structure, determining, by the processor, the co-ordinates of each feature, determining, by the processor, a critical dimension for each feature, determining, by the processor, at least one set of the features that are collinear features, fitting, by the processor, a periodic curve to the collinear features to determine the periodicity of the features, and obtaining, by the processor, placement errors for the features by comparing detected feature positions with expected positions.

2. The method of embodiment 1, wherein the structure is a block co-polymer structure or a self-assembled block co-polymer structure for use in lithography.

3. The method of embodiment 1 or embodiment 2, wherein the filter comprises a median filter 4. The method of any of embodiments 1 to 3, wherein the collinear features are determined by the processor using a transform function.

5. The method of embodiment 4, wherein the transform function is a Hough transform.

6. The method of any preceding numbered embodiment, wherein the co-ordinates are determined by calculating the middle of a bounding box.

7. The method of any preceding numbered embodiment, wherein the critical dimension is a diameter of the feature.

8. The method of any of embodiments 1 to 6, wherein the critical dimension is an area.

9. The method of any preceding embodiment, further comprising calculating, by the processor, a critical dimension uniformity.

10. The method of embodiment 9, wherein the critical dimension uniformity is calculated as three times the standard deviation of the critical dimensions of all detected features.

11. The method of any preceding embodiment, further comprising excluding, by the processor, features considered to be defective.

12. The method of embodiment 11, wherein a feature is considered to be defective if it has a diameter smaller than a certain size.

13. The method of embodiment 11, wherein a feature is considered to be defective if it is located further from an intersection of a grid larger than a certain fraction of the periodicity of the grid.

14. The method of any of embodiments 10 to 13, further comprising defining a defectivity in terms of the number of defect features as a proportion of the total number of expected features.

15. The method of any preceding embodiment, wherein the placement errors comprise local placement errors for individual features.

16. The method of any preceding numbered embodiment, wherein the placement errors comprise absolute placement errors obtained by comparing, by the processor, the co-ordinates of a detected feature with a grid obtained from fitting the periodic curve to the collinear features.

17. The method of any preceding numbered embodiment, wherein the placement errors comprise relative placement errors obtained by comparing, by the processor, the co-ordinates of a detected feature with a grid of a certain periodicity.

18. The method of any preceding numbered embodiment, further comprising comparing, by the processor, the dimensional parameters with certain parameter requirements.

19. A method to carry out an analysis of dimensional parameters of a structure, the method being implemented in a computer comprising a processor communicating with a memory and the method comprising:
using, in the processor, a filter to create a filtered image from image data of the structure,
detecting, by the processor, features in the filtered image corresponding to domains in the structure, and
determining, by the processor, a critical dimension for each feature.

20. The method of embodiment 19, wherein the structure is a block co-polymer structure or a self-assembled block co-polymer structure for use in lithography.

21. The method of embodiment 19 or embodiment 20, wherein the critical dimension is a diameter.

22. The method of embodiment 19 or embodiment 20, wherein the critical dimension is an area.

23. The method of any of embodiments 19 to 22, further comprising calculating, by the processor, a critical dimension uniformity.

24. The method of embodiment 23, wherein the critical dimension uniformity is calculated as three times the standard deviation of the critical dimensions of all detected features.

25. The method of any of embodiments 19 to 24, wherein the filter is a median filter.

26. A method to carry out an analysis of dimensional parameters of a structure, the method being implemented in a computer comprising a processor communicating with a memory and the method comprising:
using, in the processor, a filter to create a filtered image from image data of the structure,
detecting, by the processor, features in the filtered image corresponding to domains in the structure,
determining, by the processor, the co-ordinates of each feature, and
determining, by the processor, at least a set of the features that are collinear features and a corresponding line on which the features are located.

27. The method of embodiment 26 wherein the structure is a block co-polymer structure or a self-assembled block co-polymer structure for use in lithography.

28. The method of embodiment 26 or embodiment 27, wherein the collinear features are determined by the processor using a transform function.

29. The method of embodiment 28, wherein the transform function is a Hough transform.

30. The method of any of embodiments 26 to 29, further comprising fitting, by the processor, a periodic curve to the collinear features to determine periodicity of the features.

31. The method of any of embodiments 26 to 30, further comprising obtaining placement errors for the features by comparing, by the processor, detected feature positions with expected positions.

32. The method of embodiment 31, further comprising comparing, by the processor, the detected co-ordinates of the features to the line to determine offset values for the features.

33. A system to carry out an analysis of dimensional parameters of a structure, the system comprising a computer comprising a processor communicating with a memory, the processor configured to perform a method comprising:
receiving, as an input, image data of the structure,
creating a filtered image using a filter,
detecting features in the filtered image corresponding to domains in the structure,
determining the co-ordinates of each feature,
determining a critical dimension for each feature,
determining at least one set of the features that are collinear features,
fitting a periodic curve to the collinear features to determine the periodicity of the features, and
obtaining placement errors for the features by comparing detected feature positions with expected positions.

34. The system of embodiment 33, wherein the structure is a block co-polymer structure or a self-assembled block co-polymer structure for use in lithography.

35. The system of embodiment 33 or embodiment 34, wherein the filter is a median filter.

36. The system of any of embodiments 33 to 35, wherein the processor determines collinear features using a transform function.

37. The system of embodiment 36, wherein the processor implements a Hough transform.

38. The system of any of embodiments 33 to 37, wherein the processor determines the co-ordinates by calculating the middle of a bounding box.

39. The system of any of embodiments 33 to 38, wherein the critical dimension is a diameter of the feature.

40. The system of any of embodiments 33 to 38, wherein the critical dimension is an area.

41. The system of any of embodiments 33 to 40, wherein the processor is configured to calculate a critical dimension uniformity.

42. The system of embodiment 41, wherein the critical dimension uniformity is calculated as three times the standard deviation of the critical dimensions of all detected features.

43. The system of any of embodiments 33 to 42, wherein the processor is configured to exclude features considered to be defective.

44. The system of embodiment 43, wherein a feature is considered to be defective if it has a diameter smaller than a certain size.

45. The system of embodiment 43, wherein a feature is considered to be defective if it is located further from an intersection of a grid larger than a certain fraction of the periodicity of the grid.

46. The system of any of embodiments 43 to 45, wherein the processor is configured to define a defectivity in terms of the number of defect features as a proportion of the total number of expected features.

47. The system of any of embodiments 33 to 46, wherein the placement errors comprise local placement errors for individual features.

48. The system of any of embodiments 33 to 47, wherein the placement errors comprise absolute placement errors and the processor is configured to obtain the absolute placement errors by comparing the co-ordinates of a detected feature with a grid obtained from fitting the periodic curve to the collinear features.

49. The system of any of embodiments 33 to 47, wherein the placement errors comprise relative placement errors and the processor is configured to obtain the relative placement errors by comparing the co-ordinates of a detected feature with a grid of a certain periodicity.

50. The system of any of embodiments 33 to 49, wherein the processor is configured to compare the dimensional parameters with certain parameter requirements.

51. A system to carry out an analysis of dimensional parameters of a structure, the system comprising a computer comprising a processor communicating with a memory, the processor configured to perform a method comprising:
receiving, as an input, image data of the structure,
creating a filtered image using a filter,
detecting features in the filtered image corresponding to domains in the structure, and
determining a critical dimension for each feature.

52. The system of embodiment 51 wherein the structure is a block co-polymer structure or a self-assembled block co-polymer structure for use in lithography.

53. The system of embodiment 51 or embodiment 52, wherein the critical dimension is a diameter.

54. The system of embodiment 51 or embodiment 52, wherein the critical dimension is an area.

55. The system of any of embodiments 51 to 54, wherein the processor is configured to calculate a critical dimension uniformity.

56. The system of embodiment 55, wherein the critical dimension uniformity is calculated as three times the standard deviation of the critical dimensions of all detected features.

57. The system of any of embodiments 51 to 55, wherein the processor is configured to implement a median filter.

58. A system to carry out an analysis of dimensional parameters of a structure, the system comprising a computer comprising a processor communicating with a memory, the processor configured to perform a method comprising:
receiving, as an input, image data of the structure,
creating a filtered image using a filter,
detecting features in the filtered image corresponding to domains in the structure,
determining the co-ordinates of each feature, and
determining at least a set of the features that are collinear features and a corresponding line on which the features are located.

59. The system of embodiment 58, wherein the structure is a block co-polymer structure or a self-assembled block co-polymer structure for use in lithography.

60. The system of embodiment 58 or embodiment 59, wherein the processor is configured to determine the collinear features using a transform function.

The system of embodiment 60, wherein the transform function is a Hough transform.

61. The system of any of embodiments 58 to 61, wherein the processor is further configured to fit a periodic curve to the collinear features to determine periodicity of the features.

62. The system of any of embodiments 58 to 62, wherein the processor is further configured to obtain placement errors for the features by comparing detected feature positions with expected positions.

63. The system of any of embodiments 58 to 62, wherein the processor is further configured to obtain placement errors for the features by comparing detected feature positions with expected positions.

64. The system of embodiment 63, wherein the processor is further configured to compare the detected co-ordinates of the features to the line to determine offset values for the features.

65. A computer readable medium carrying a computer program which when run on a computer causes the computer to carry out the method of any of embodiments 1 to 32.

66. A computer program product which when run on a computer causes the computer to carry out the method of any of embodiments 1 to 32.

In embodiments of the invention, the data concerning critical dimension, critical dimension uniformity, periodicity, placement error and defectivity can be compared with minimum application specifications to determine whether a structure is suitable for use. Such a comparison may be made automatically and a warning signal may be given if the structure fails one or more specifications.

It will thus be seen that in an embodiment there is provided an apparatus and method to analyze one or more properties of a self-assembled block co-polymer structure and in particular to obtain data relating to critical dimension, critical dimension uniformity, periodicity, placement error, and/or defectivity. Such data may be used to confirm that a self-assembled block co-polymer structure meets specific application specifications, and/or to determine the reliability of a particular self-assembly process.

While in the example given above the structure analyzed is a hexagonal structure formed by graphoepitaxy, other structures could be analyzed including two-dimensional structures formed from chemical epitaxy, large extended arrays, one dimensional structures such as a single row of domains, and even isolated single domains. For example, in the case of a single row of domains a method according to an embodiment of the invention can be used to determine the periodicity of domains along the row in one dimension, and also to determine an offset of the domains from the row in another dimension. For isolated single domains their co-ordinates, and a critical dimension such as diameter and/or area can be calculated.

While in some embodiments of the invention, critical dimension (and critical dimension uniformity), periodicity, placement error (of various types) and defectivity may all be determined, in other embodiments it may be sufficient to determine, say, only critical dimension and critical dimension uniformity, or only placement error, and thus some embodiments of the invention may use only selected steps of the above described method. Further, while the invention is particularly useful in the context of a self-assembled block copolymer structure for use in lithography it is not limited thereto and might be used in other contexts in which block copolymer structures are formed (whether self-assembled or otherwise) and require dimensional analysis. Moreover, while the disclosure herein has focused on a block co-polymer structure, an embodiment of the invention is applicable to other structures, such as structures having domains or having similar characteristics as a block co-polymer structure.

In the above example the image processing steps may be carried out in the processor 102 by any combination of software, firmware or hardware. The image processing steps may be carried out by software running on otherwise conventional hardware, or by specially configured hardware or by any combination. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine-readable instruction may be embodied in two or more computer programs. The two or more computer programs may be stored on one or more different memories and/or data storage media.

While specific embodiments of the invention have been described above, it will be appreciated that the invention may be practiced otherwise than as described.

The invention claimed is:

1. A method to carry out an analysis of dimensional parameters of a structure, the method being implemented in a computer comprising a processor communicating with a memory and the method comprising:
   detecting, by the processor, features in a filtered image from image data of the structure, the features corresponding to domains in the structure,
   determining, by the processor, the co-ordinates of each feature,
   determining, by the processor, a critical dimension for each feature,
   determining, by the processor, at least one set of the features that are collinear features,
   fitting, by the processor, a periodic curve to the collinear features to determine the periodicity of the features, and
   obtaining, by the processor, placement errors for the features by comparing detected feature positions with expected positions.

2. The method of claim 1, wherein the structure is a block co-polymer structure or a self-assembled block co-polymer structure for use in lithography.

3. The method of claim 1, wherein the filter comprises a median filter.

4. The method of claim 1, wherein the collinear features are determined by the processor using a transform function.

5. The method of claim 4, wherein the transform function is a Hough transform.

6. The method of claim 1, wherein the co-ordinates are determined by calculating the middle of a bounding box.

7. The method of claim 1, wherein the critical dimension is a diameter of the feature.

8. The method of claim 1, wherein the critical dimension is an area.

9. The method of claim 1, further comprising calculating, by the processor, a critical dimension uniformity.

10. The method of claim 9, wherein the critical dimension uniformity is calculated as three times the standard deviation of the critical dimensions of all detected features.

11. The method of claim 1, further comprising excluding, by the processor, features considered to be defective.

12. The method of claim 11, wherein a feature is considered to be defective if it has a diameter smaller than a certain size.

13. The method of claim 11, wherein a feature is considered to be defective if it is located further from an intersection of a grid than a certain fraction of the periodicity of the grid.

14. The method of claim 10, further comprising defining a defectivity in terms of the number of defect features as a proportion of the total number of expected features.

15. The method of claim 1, wherein the placement errors comprise local placement errors for individual features.

16. The method of claim 1, wherein the placement errors comprise absolute placement errors obtained by comparing, by the processor, the co-ordinates of a detected feature with a grid obtained from fitting the periodic curve to the collinear features.

17. The method of claim 1, wherein the placement errors comprise relative placement errors obtained by comparing, by the processor, the co-ordinates of a detected feature with a grid of a certain periodicity.

18. The method of claim 1, further comprising comparing, by the processor, the dimensional parameters with certain parameter requirements.

19. A method to carry out an analysis of dimensional parameters of a structure, the method being implemented in a computer comprising a processor communicating with a memory and the method comprising:
   detecting, by the processor, features in a filtered image from image data of the structure, the features corresponding to domains in the structure,
   determining, by the processor, the co-ordinates of each feature,
   determining, by the processor, at least a set of the features that are collinear features,
   determining, by the processor, a periodicity of the collinear features, and
   obtaining, by the processor, a placement error for one or more of the features using the periodicity.

20. A non-transitory computer readable medium having instructions which when run on a computer cause the computer to carry out a method comprising:
   detecting features in a filtered image from image data of a structure, the features corresponding to domains in the structure,
   determining the co-ordinates of each feature,
   determining at least one set of the features that are collinear features,
   fitting a periodic curve to the collinear features to determine the periodicity of the features, and
   obtaining a placement error for one or more of the features by comparing a detected feature position with an expected feature position determined based on the periodicity.

21. A non-transitory computer readable medium having instructions which when run on a computer cause the computer to carry out a method comprising:
   detecting features in a filtered image from image data of the structure, the features corresponding to domains in the structure,
   determining at least a set of the features that are collinear features,
   determining a periodicity of the collinear features, and
   obtaining a placement error for one or more of the features using the periodicity.

* * * * *